United States Patent [19]
Arai

[11] Patent Number: 4,578,143
[45] Date of Patent: Mar. 25, 1986

[54] METHOD FOR FORMING A SINGLE CRYSTAL SILICON LAYER

[75] Inventor: Tetsuji Arai, Kobe, Japan

[73] Assignee: Ushio Denki Kabushiki Kaisha, Tokyo, Japan

[21] Appl. No.: 526,453

[22] Filed: Aug. 25, 1983

[30] Foreign Application Priority Data

Aug. 26, 1982 [JP] Japan .................. 57-146940

[51] Int. Cl.[4] .............................................. C30B 1/08
[52] U.S. Cl. .............................................. 156/617 R
[58] Field of Search ............... 156/617 R, DIG. 88, 156/DIG. 73, 620, 622, 616 R; 427/53.1, 55; 250/494, 495

[56] References Cited

U.S. PATENT DOCUMENTS 2,933,384  4/1960  Welker et al. ............... 156/617 R
3,630,684  12/1971  Keller ........................... 156/620
4,081,313  3/1978  McNeilly et al. ............. 156/612

FOREIGN PATENT DOCUMENTS 0021829  2/1983  Japan ..................... 156/DIG. 73
8303851  11/1983  PCT Int'l Appl. ......... 156/DIG. 88

Primary Examiner—Hiram H. Bernstein
Attorney, Agent, or Firm—Ziems, Walter & Shannon

[57] ABSTRACT

Disclosed herein is a process for forming a single crystal silicon layer by heating a wafer, which is made of a single crystal silicon substrate and a starting silicon layer made of amorphous or polycrystalline silicon and provided on the silicon substrate, in accordance with the epitaxial growth technique. The process comprises providing a heat source which is formed of a plurality of tubular lamps provided side by side with their longitudinal axes extending substantially in parallel with one another in a second plane lying above and substantially in parallel with a first plane—in which the wafer is placed—and a tubular melting-lamp provided at a position between the first and second planes and with its longitudinal axis substantially in parallel with the longitudinal axes of the tubular lamps in the second plane; and moving the wafer in the first plane and in a direction perpendicular to the longitudinal axes of the plurality of tubular lamps and that of the tubular melting-lamp in a state that all the tubular lamps of the heat source, including the tubular melting-lamp, are lit on. The above process can convert the starting silicon layer in its entirety into a single crystal silicon layer in a relatively short period of time and without danger of damaging the wafer. The above process facilitates formation of single crystal silicon layers which make up SOI structures.

5 Claims, 3 Drawing Figures

METHOD FOR FORMING A SINGLE CRYSTAL SILICON LAYER

BACKGROUND OF THE INVENTION (1) Field of the Invention

This invention relates to a process for forming a single crystal silicon layer on a single crystal silicon substrate in accordance with the epitaxial growth technique.

(2) Description of the Prior Art

As a process for forming a single crystal silicon layer on a single crystal silicon substrate by making use of the epitaxial growth techique for fabrication of a semiconductor device, it has been known to form a starting silicon layer made of amorphous silicon (hereinafter called "a-silicon") or polycrystalline silicon on a single crystal silicon substrate and then to heat the starting silicon layer so as to allow the starting silicon layer to regrow into a single crystal layer having the same crystal plane as the single crystal of the substrate. For example, it has been known to heat a wafer, in which an a-silicon layer of for example 4000 Å thick is formed on a surface of a single crystal silicon substrate, for example at about 600° C. and approximately for 80 minutes in a resistance furnace so that the a-silicon layer is converted into a single crystal layer. The above process however requires to continue the heating over a relatively long period of time and is thus impractical from the viewpoint of productivity. It may be possible to increase the growth speed of each single crystal by raising the heating temperature in the above process. However, use of a high heating temperature in the above process is accompanied by such drawbacks that wafers tend to develop "warpage" or "contamination" and the production yield hence becomes poor.

On the other hand, it has recently been studied to develop a process for forming a single crystal layer by directing a laser beam for a short period of time onto a starting silicon layer formed on a single crystal silicon layer to melt the starting silicon layer and then solidifying the thus-molten silicon layer in accordance with the epitaxial growth technique. Reference may for example be made to U.S. Pat. No. 4,309,225. In the above process which makes use of a laser beam, an a-silicon layer is scanned by the small spot light of the laser beam. It has been pointed out, as a shortcoming of the above process, that the laser beam develops certain excessively-heated portions in the boundary region between each scanning line, along which the small spot light of the beam passes, and its adjacent scanning line and disturbs the crystalline texture there, thereby resulting in formation of grain boundaries; or the above process requires too much time if the interval of the scanning lines is shortened. Therefore, this laser beam process is difficult to form single crystal silicon layers which make up SOI (Silicon on Insulator) structures useful for fabrication of belayered three-dimensional IC devices which are considered to incorporate "the latest IC system".

SUMMARY OF THE INVENTION

An object of this invention is to provide a novel process for forming a single crystal silicon layer by heating an a-silicon or polycrystalline silicon layer on a single crystal silicon substrate in accordance with the epitaxial growth technique so that the a-silicon layer or polycrystalline silicon layer may be converted in its entirety into the single crystal silicon layer owing to an epitaxial growth in a relatively short period of time without damaging the wafer.

Another object of this invention is to provide a process which facilitates fabrication of a single crystal silicon layer making up an SOI structure.

In one aspect of this invention, there is accordingly provided a process for forming a single crystal silicon layer by heating a wafer, which is made of a single crystalline silicon substrate and a starting silicon layer made of amorphous or polycrystalline silicon and provided on the silicon substrate, in accordance with the epitaxial growth technique, which process comprises the following steps:

providing a heat source which comprises a plurality of tubular lamps provided side by side with their longitudinal axis extending substantially in parallel with one another in a second plane lying above and substantially in parallel with a first plane, in which the wafer is placed, and a tubular melting-lamp provided at a position between the first and second planes and with its longitudinal axis substantially in parallel with the longitudinal axes of the tubular lamps in the second plane; and moving the wafer in the first plane and in a direction perpendicular to the longitudinal axes of the tubular lamps in a state that all the tubular lamps of the heat source, including the tubular melting-lamp, are lit on to form a narrow molten region on the wafer so as to convert the starting silicon layer into the single crystal silicon layer.

The process according to this invention can convert the starting silicon layer in its entirety into a single crystal silicon layer in a relatively short period of time and without danger of damaging the wafer. It also facilitates formation of single crystal silicon layers which make up SOI structures.

The above and other objects, features and advantages of the present invention will become apparent from the following description and the appended claims, taken in cojunction with the accompanying drawings.

DETAILED DESCRIPTION OF THE INVENTION

Figure 1:
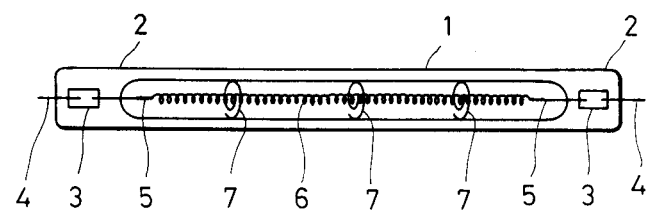
FIG. 1 is a schematic illustration of one example of a tubular lamp useful in the practice of this invention.

The present invention will be described in further detail with reference to the accompanying drawings. FIG. 1 is a schematic illustration of one example of tubular lamps which make up the light source of a below-described heat source useful in the practice of the process according to this invention. The tubular lamp may for example be a halogen incandescent lamp of 2.5 KW rated power consumption. In FIG. 1, numeral 1 indicates an envelope, which includes sealed portions 2,2 at both ends thereof. Metal foils 3,3 are respectively embedded and sealed in their corresponding sealed portions 2,2. Outer leads 4,4 and inner leads 5,5 extend respectively from their corresponding foils 3,3. Between the inner leads 5,5 is extended a filament 6 of about 16 cm long along the longitudinal axis of the envelope 1. Numeral 7 indicates supports for holding the filament 6 in registration with the longitudinal axis of the envelope 1. The envelope 1 contains a trace amount of a halogen element together with a rare gas. The above lamp is known to have such features as compactness and long service life.

Figure 2:
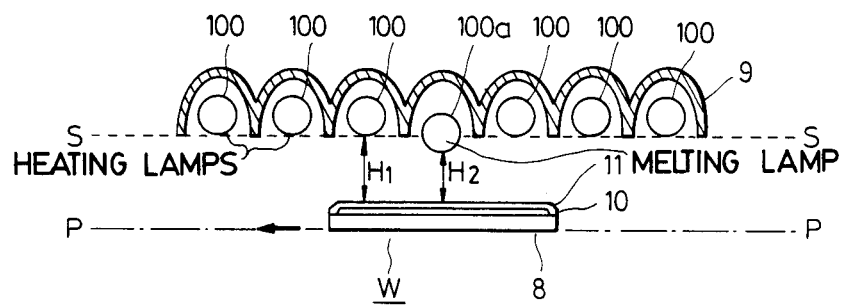
FIG. 2 is a schematic and fragmentary illustration of one example of a heat source useful in the practice of this invention.

Referring now to FIG. 2, a wafer W which has been formed by applying a silicon layer made for example of a-silicon on a substrate 8 of single crystal silicon is placed in a first plane P. A plurality of tubular lamps 100, which have the same structure as the tubular lamp depicted in FIG. 1, is arranged side by side above the first plane P in such a manner that the tubular lamps 100 lie in a second plane S parallel with the first plane P and the longitudinal axes of the tubular lamps 100 are parallel with one another. Besides, a tubular melting-lamp 100a similar to the tubular lamps 100 is disposed at a level between the second plane S and the first plane P, centrally of the area of arrangement of the tubular lamps 100 lying in the second plane S, and in parallel with the tubular lamps 100. A reflector plate 9 covers above these lamps 100 and 100a. The wafer W is moved along the first plane P and, as indicated by an arrow, in a direction perpendicular to the longitudinal axes of the tubular lamps 100 and tubular melting-lamp 100a.

Figure 3:
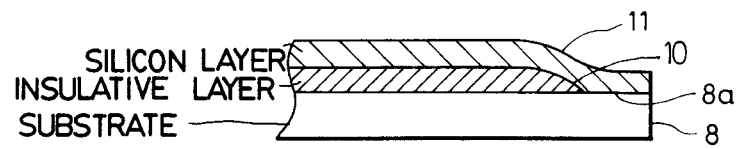
FIG. 3 is an enlarged, fragmentary and cross-sectional view of a wafer.

FIG. 3 is an enlarged, fragmentary and cross-sectional view of one example of the wafer W equipped with a starting silicon layer 11 which is made of a-silicon or polycrystalline silicon and is to be converted into a single crystal silicon layer. A substrate 8 is made of single crystal silicon. In the illustrated embodiment, the wafer W has, on the upper of the substrate 8, an insulative layer 10 made of an insulative material such as silicon oxide or silicon nitride. The starting silicon layer 11 is formed on the insulative layer 10 and an exposed surface portion of the substrate 8. Thus, the substrate 8 and starting silicon layer 11 are kept in direct contact at a peripheral portion 8a of the substrate 8. The following processing is to be applied to the wafer W in accordance with this invention. Namely, the melting-lamp 100a and tubular lamps 100 are lit and the wafer W is moved in such a way that the entire portion of the wafer W passes right under the tubular melting-lamp 100a. The wafer W is preheated to 1100°-1400° C. by light radiated from the lamps 100 until it reaches a position right underneath the melting-lamp 100a. All portions of the wafer W are first heated to temperatures equal to or higher than the melting point of the starting silicon layer after it has reached the position right underneath the melting-lamp 100a. The silicon of the starting silicon layer 11 is molten at a linear portion extending right underneath and along the lengthwise direction of the melting-lamp 100a. The thus-molten silicon, which is present at the linear portion, changes into a single crystal in the same direction of crystal plane as that of the single crystal silicon of the substrate 8 owing to its epitaxial growth in the liquid phase. Since the wafer W is moved, the starting silicon layer 11 is eventually processed in its entirety. Namely, the above conversion into the single crystal is effected, similar to the zone-melting-method or zone-refining-method, by heating the starting silicon layer 11 from one linear portion to the next which reaches successively the position right underneath the melting-lamp 100a as the wafer W is moved. Accordingly, the starting silicon layer 11 is converted in its entirety into a single crystal eventually. Here, it is desirous to use argon gas as the atmosphere in the heat source. The growth of the single crystal silicon is effected using the single crystal silicon, which is present at the peripheral portion 8a with which the starting silicon layer 11 is in direct contact, as a seed crystal for starting the crystal growth from that particular point. The wafer W is moved with the peripheral portion 8a of the substrate 8 kept in the forefront thereof. This permits to the single crystal to grow in the direction of the layer, also on the insulative layer 10 (lateral epitaxy). A higher temperature is produced at a position right underneath the melting-lamp 100a, because the melting-lamp 100a is closer to the plane P in which the wafer W is placed and the linear portion, located right underneath the melting-lamp 100a, is exposed to a radiation of larger energy. If it is unable to make the distance $H_2$ between the melting-lamp 100a and the wafer W sufficiently large, it is necessary to light the melting-lamp 100a with an input somewhat greater than that to be fed to the remaining lamps 100.

It is preferred to operate the lamps 100 and 100a in such a way that the temperature of the wafer W reaches, at the position right underneath the melting-lamp 100a, a temperature range of 1410°-1480° C. above or at the melting point (about 1410° C.) of silicon.

If a wafer is heated at the same time and in its entirety at temperatures as high as 1410°-1480° C. for a long period of time, there is a danger that the wafer would be molten or would develop "warpage". According to the process of this invention, it is however possible to convert the starting silicon layer in its entirety into a layer of single crystal coincided in the direction of crystal plane with the substrate by the epitaxial growth technique, without damaging the substrate or developing "warpage". Moreover, the process of this invention does not develop any grain boundaries, thereby ensuring the formation of a layer of single crystal which has a single crystal plane. In order to permit easy control of the heating temperature, the power consumption of the lamps, interval of the lamps, spacing between the lamps and wafer, etc. may be suitably adjusted so as to select with relative ease the heating temperature from the range of 1100°-1480° C. The moving speed of the wafer varies of course depending on the temperature at the position right underneath the melting-lamp 100a, which temperature may range from 1410° C. to 1480° C. It is generally preferred to cause the wafer to pass at a speed of 0.1 cm/sec. or faster right underneath the melting-lamp 100a. Excessively slow moving speeds may induce such drawbacks that the wafer may be excessively heated at some portions and the resulting molten portions tend to swell up in spherical shapes due to surface tensions, leading to a loss of planarity and non-uniformity in thickness of the resulting single crystal layer. However, excessively fast moving speeds cannot raise the temperature of the wafer to any of the desired temperature levels, leading to insufficient conversion into a single crystal. Thus, the upper limit of the moving speed is about 8 cm/sec. or so.

In the process according to this invention, there are used, as an element of a heat source, tubular lamps whose radiant light varies instantaneously in accordance with any changeover from one operation mode to another, for example, turning-on operation, turning-off operation, lighting operation with rated power or lighting operation with an excess input. Accordingly, the present invention is extremely advantageous in that use of such lamps permits easy control of the heating temperature, facilitates their maintenance or their replacement even if the lamps are deteriorated, and can avoid contamination of wafers. Although halogen incandescent lamps were used in the above embodiment, similar effects can be brought about from the use of discharge lamps such as xenon long-arc lamps as an element of a heat source.

EXAMPLE

As a heat source, there was employed a heat source having the same structure as depicted in FIG. 2 and equipped as the lamp 100a and lamps 100 with halogen incandescent lamps of 2.5 KW rated power consumption, each of which lamps had the same structure as illustrated in FIG. 1. A wafer W, which had the same structure as shown in FIG. 3 and had been formed by forming a 0.2 μm-thick insulative layer 10 of silicon oxide on the upper surface of a single crystal silicon substrate of about 0.5 mm thick and then a starting silicon layer 11 of a-silicon of about 0.5 μm thick over the insulative layer 10, was moved along the plane P and at 0.4 cm/sec. for its heat treatment. The distance $H_2$ between the melting-lamp 100a and the upper surface of the wafer, i.e., the upper surface of the starting silicon layer 11 was about 5 mm, whereas the distance $H_1$ between the plane S, in which the lamps 100 other than the lamp 100a lied, and the upper surface of the wafer W was about 9 mm. As a result, a single crystal layer of 0.5 μm thick was formed in such a state that it was superposed over the substrate 8 with the insulative layer 10 interposed therebetween. It is thus possible to make an SOI structure which permits with extreme ease the fabrication of a layered three-dimensional integrated circuit, by forming a through-hole through the insulative layer 10 and electrically connecting the thus-formed single crystal layer with the substrate 8.

Having now fully described the invention, it will be apparent to one of ordinary skill in the art that many changes and modifications can be made thereto without departing from the spirit or scope of the invention as set forth herein.

What is claimed is:

1. A process for forming a single crystal silicon layer by heating a wafer, which is made of a single crystal silicon substrate and a starting silicon layer made of amorphous or polycrystalline silicon and provided on the silicon substrate, in accordance with the epitaxial growth technique, which process comprises the following steps:

providing a heat source which comprises a plurality of tubular lamps provided side by side with their longitudinal axes extending substantially in parallel with one another in a second plane lying above and substantially in parallel with a first plane, in which the wafer is placed, and a tubular melting lamp provided at a position between the first and second planes and with its longitudinal axis substantially in parallel with the longitudinal axes of the tubular lamps in the second plane; and moving the wafer in the first plane and in a direction perpendicular to the longitudinal axes of the tubular lamps, all the tubular lamps of the heat source, including the tubular melting lamp, being lit, to form a narrow molten region on the wafer so as to convert the starting silicon layer into the single crystal silicon layer.

2. The process as claimed in claim 1, wherein the substrate of the wafer has an insulative layer on the upper surface thereof, the starting silicon layer is formed on the substrate with the insulative layer interposed therebetween except for at least one peripheral portion thereof where the starting silicon layer is in direct contact with the substrate, and the wafer is moved with said peripheral portion kept in the forefront thereof.

3. The process as claimed in claim 2, wherein the insulative layer is made of silicon oxide or silicon nitride.

4. The process as claimed in claim 1, wherein the starting silicon layer is heated to 1100°–1400° C. by the tubular lamps disposed in the second plane, the starting silicon layer is heated to 1410°–1480° C. by the tubular melting lamp, and the wafer is moved at 0.1–8 cm/sec.

5. The process as claimed in claim 1, wherein the tubular melting lamp is lit with an input larger than the input to the tubular lamps in the second plane.

* * * * *